United States Patent
Kubota et al.

(10) Patent No.: US 7,869,482 B2
(45) Date of Patent: Jan. 11, 2011

(54) SEMICONDUCTOR LASER DEVICE

(75) Inventors: Masashi Kubota, Kyoto (JP);
Kuniyoshi Okamoto, Kyoto (JP);
Taketoshi Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/385,238

(22) Filed: Apr. 2, 2009

(65) Prior Publication Data
US 2009/0252191 A1 Oct. 8, 2009

(30) Foreign Application Priority Data
Apr. 3, 2008 (JP) .............................. 2008-096825

(51) Int. Cl.
H01S 3/00 (2006.01)
H01S 3/10 (2006.01)
H01S 5/00 (2006.01)
H01S 3/08 (2006.01)

(52) U.S. Cl. .................. 372/99; 372/50.11; 372/20; 372/96; 372/2

(58) Field of Classification Search .............. 372/99, 372/50.11, 20, 96, 2
See application file for complete search history.

(56) References Cited
U.S. PATENT DOCUMENTS
5,568,499 A * 10/1996 Lear .................. 372/45.01

2008/0285609 A1 * 11/2008 Ohta et al. .............. 372/44.011

OTHER PUBLICATIONS

T. Takeuchi et al., "Theoretical Study of Orientation Dependence of Piezoelectric Effects in Wurtzite Strained GaInN/GaN Heterostructures and Quantum Wells", Jpn. J. Appl. Phys. vol. 39 (2000), pp. 413-416.

"Characteristics of InGaN laser diodes in the pure blue region," Shin-ichi Nagahama et al., Applied Physics Letters, vol. 79, No. 13; Sep. 24, 2001; pp. 1948-1950.

"Gain suppression phenomena observed in $In_xGa_{1-x}N$ quantum well laser diodes emitting at 470 nm," K. Kojima et al.; Applied Physics Letters, vol. 89 (2006); pp. 241127-1 through 241127-3.

* cited by examiner

*Primary Examiner*—Minsun Harvey
*Assistant Examiner*—Patrick Stafford
(74) *Attorney, Agent, or Firm*—Rabin & Berdo, P.C.

(57) ABSTRACT

A semiconductor laser device is made of a group III nitride semiconductor having a major growth surface defined by a nonpolar plane or a semipolar plane. The semiconductor laser device includes a cavity having an active layer containing In and distributed Bragg reflectors coating both cavity end faces of the cavity respectively. In each of the distributed Bragg reflectors, a central wavelength $\lambda_c$ of a reflectance spectrum satisfies the relation $\lambda_{SP}-10$ nm$\leq\lambda_c\leq\lambda_{SP}+10$ nm with respect to an emission peak wavelength $\lambda_{SP}$ of spontaneous emission in the active layer.

23 Claims, 9 Drawing Sheets m-PLANE →

SEMICONDUCTOR LASER DEVICE

BACKGROUND OF THE INVENTION

1. Field of the Invention

The present invention relates to a semiconductor laser device employing group III nitride semiconductors.

2. Description of Related Art

Group III nitride semiconductors are group III-V semiconductors employing nitrogen as a group V element, and typical examples thereof include aluminum nitride (AlN), gallium nitride (GaN) and indium nitride (InN), which can be generally expressed as $Al_X In_Y Ga_{1-X-Y} N$ ($0 \leq X \leq 1$, $0 \leq Y \leq 1$ and $0 \leq X+Y \leq 1$).

A blue or green wavelength laser source is increasingly used in the fields of an full color display, high-density recording in an optical disk represented by a DVD, image processing, medical equipment, measuring equipment and the like. Such a laser source is comprised of a laser diode employing GaN semiconductors, for example.

A GaN semiconductor laser diode is manufactured by growing group III nitride semiconductors on a gallium nitride (GaN) substrate having a major surface defined by a c-plane by metal-organic vapor phase epitaxy (MOVPE). More specifically, an n-type GaN contact layer, an n-type AlGaN cladding layer, an n-type GaN guide layer, an active layer (light emitting layer), a p-type GaN guide layer, a p-type AlGaN cladding layer and a p-type GaN contact layer are successively grown on the GaN substrate by metal-organic vapor phase epitaxy, to form a semiconductor multilayer structure consisting of the semiconductor layers. The active layer emits light by recombination of electrons injected from the n-type layers and positive holes injected from the p-type layers. The light is confined between the n-type AlGaN cladding layer and the p-type AlGaN cladding layer, and propagated in a direction perpendicular to the stacking direction of the semiconductor multilayer structure. Cavity end faces are formed on both ends in the propagation direction, and the light is resonantly amplified between the pair of cavity end faces while repeating induced emission, and partially emitted from the cavity end faces as laser beams.

SUMMARY OF THE INVENTION

The crystal structure of a group III nitride semiconductor can be approximated by a hexagonal system, and four nitrogen atoms are bonded to each group III atom. The four nitrogen atoms are located on four vertices of a regular tetrahedron having the group III atom disposed at the center thereof. One of the four nitrogen atoms is located in a +c-axis direction of the group III atom, while the remaining three nitrogen atoms are located on a −c-axis side of the group III atom. Due to the structure, the direction of polarization of the group III nitride semiconductor is along the c-axis.

In the semiconductor laser diode having the major growth surface defined by a c-plane, therefore, a polarization field is applied to the active layer. Due to the polarization field, a remarkable wavelength shift toward short-wavelength region (so-called blueshift) is caused before reaching laser oscillation from spontaneous emission in a low current density region. While the In composition in the active layer must be increased (to not less than 5%, for example) when preparing a long-wavelength laser of not less than 450 nm, crystal heterogeneity is thereby increased, to result in the so-called band tail. Band filling resulting from injection of carriers into the band tail serves as another factor for the blueshift.

More specifically, blueshifts of 15 nm, 27 nm and 47 nm are caused from an emission peak wavelength of spontaneous emission in a laser diode having a major growth surface defined by a c-plane when laser oscillation wavelengths are 445 nm, 460 nm and 470 nm respectively, before reaching laser oscillation from spontaneous emission (see FIG. 8, and refer to S. Nagahama et al., Appl. Phys. Lett, 79, 1948 (2001); and K. Kojima et al., Appl. Phys. Lett. 89, 241127 (2006)). Due to such blueshifts, it is difficult to design a cavity structure, particularly reflector structures on the cavity end faces, and a long-wavelength laser device is consequently hard to implement.

FIG. 15 is a diagram for illustrating the principle of a blueshift resulting from a polarization field. When an active layer has a quantum well structure, a polarization field is applied to a quantum well layer thereof. A band is bent (inclined) due to the polarization field, and hence a band gap Eg is effectively small (the left side in FIG. 15). When a current density is increased for laser oscillation, however, electrons are stored in a conduction band, and holes are stored in a valence band (the center and the right side in FIG. 15). The carriers are localized in response to the bend of the band, and form an electric field canceling the polarization field. In other words, the polarization field is shielded. Consequently, the bend of the band is reduced, whereby the band gap Eg is increased and the emission wavelength is reduced. For example, laser oscillation is caused in a blue wave range even if a spontaneous emission peak wavelength is in a green wave range.

If the In composition is increased for wavelength elongation, the polarization field is enlarged and hence a blueshift resulting from the shielding of the polarization field more remarkably appears.

FIG. 16 is a diagram for illustrating a blueshift resulting from band filling. The axis of ordinates shows energy, and the axis of abscissas shows a state density. The state density is ideally zero below the band gap Eg, and preferably rapidly rises at the band gap Eg, as shown by two-dot chain lines. In practice, however, particularly an active layer containing In exhibits characteristics shown by a solid line due to heterogeneity of crystals. In other words, the state density at energy lower than the band gap Eg is not zero but causes a band tail.

When carriers are injected, the energy level of the band tail is successively filled. This is the band filling. The band filling progresses when the current density is increased, and laser oscillation is caused when a gain exceeds loss. Therefore, the emission wavelength shifts to a short-wavelength side before reaching laser oscillation from spontaneous emission.

When the In composition in the active layer is increased, the heterogeneity of crystals is increased and the band tail is lengthened (see a dotted line in FIG. 16). Therefore, the blueshift more remarkably appears. Consequently, it is difficult to correctly estimate the oscillation wavelength.

Accordingly, an object of the present invention is to provide a semiconductor laser device reducing a blueshift and implementing long-wavelength oscillation.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
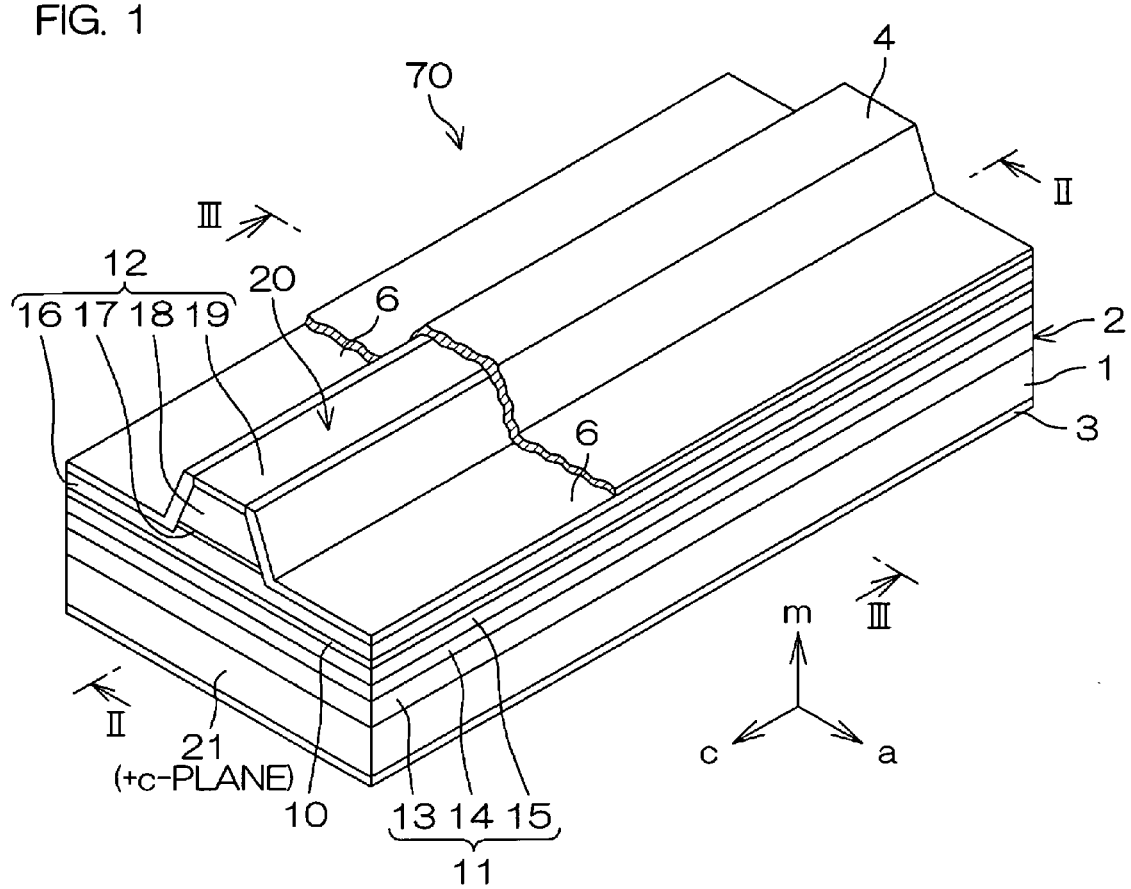
FIG. 1 is a perspective view for illustrating the structure of a semiconductor laser diode according to an embodiment of the present invention.

A semiconductor laser device according to an embodiment of the present invention is made of a group III nitride semiconductor having a major growth surface defined by a nonpolar plane or a semipolar plane. The semiconductor laser device includes a cavity including an active layer containing In and distributed Bragg reflectors coating both cavity end faces of the cavity respectively. In each of the distributed Bragg reflectors, a central wavelength $\lambda_c$ of a reflectance spectrum satisfies the relation $\lambda_{SP}-10$ nm$\leq\lambda_c\leq\lambda_{SP}+10$ nm with respect to an emission peak wavelength $\lambda_{SP}$ of spontaneous emission in the active layer.

According to the structure, the semiconductor laser device is constituted of the group III nitride semiconductor having the major growth surface defined by a nonpolar plane or a semipolar plane. Spontaneous piezoelectric polarization in the active layer disappears when the major growth surface is defined by a nonpolar plane, while the spontaneous piezoelectric polarization in the active layer is reduced when the major growth surface is defined by a semipolar plane. Therefore, a wavelength shift toward short-wavelength region (so-called blueshift) resulting from shielding of a polarization field can be reduced.

On the other hand, the active layer has the composition containing In for attaining wavelength elongation, while a band tail results from crystal heterogeneity in the active layer containing In.

Therefore, both cavity end faces are coated with the distributed Bragg reflectors (DBR). More specifically, each distributed Bragg reflector is designed so that the central wavelength $\lambda_c$ of the reflectance spectrum thereof satisfies the relation $\lambda_{SP}-10$ nm$\leq\lambda_c\leq\lambda_{SP}+10$ nm with respect to the emission peak wavelength $\lambda_{SP}$ of the spontaneous emission in the active layer. Thus, induced emission around the spontaneous emission peak wavelength is prompted, whereby a blueshift resulting from band filling is suppressed. Thus, a long-wavelength semiconductor laser device can be implemented.

More preferably, the distributed Bragg reflector is so defined that the central wavelength $\lambda_c$ of the reflectance spectrum thereof satisfies the relation $\lambda_{SP}-5$ nm$\leq\lambda_c\leq\lambda_{SP}$ with respect to the emission peak wavelength $\lambda_{SP}$ of the spontaneous emission in the active layer. A laser oscillation wavelength is smaller than the spontaneous emission peak wavelength, and hence laser oscillation can be more efficiently caused to contribute to reduction of a threshold current and suppression of wavelength shortening by setting the central wavelength $\lambda_c$ of the reflectance spectrum of the distribution Bragg reflector in the aforementioned range.

The emission peak wavelength of the spontaneous emission may be a peak wavelength of a current injection spectrum at a current density of not more than 0.1 kA/cm$^2$.

Further, the emission peak wavelength of the spontaneous emission may be a peak wavelength of a current injection spectrum at a current density of not more than 500 µA/cm$^2$.

In addition, the emission peak wavelength of the spontaneous emission may be a photoluminescence peak wavelength in a case of weakly exciting the active layer at an excitation density of not more than 30 W/cm$^2$.

The emission wavelength of the active layer may be not less than 450 nm. In order to emit light in a long wave range of not less than 450 nm, the In composition in the active layer (particularly a quantum well layer in a case where the active layer has a quantum well structure) must be increased (to not less than 5%, for example). Wavelength shortening resulting from band filling caused in this case can be suppressed, whereby a long-wavelength laser of not less than 450 nm can be easily implemented, and a cavity structure (particularly a reflector structure) is not hard to design.

Preferably, the active layer includes a quantum well layer having a thickness of not more than 100 Å. Luminous efficiency can be improved by a quantum effect by setting the thickness of the quantum well layer to not more than 100 Å. Therefore, the effect of improving the luminous efficiency by the quantum effect is attained in addition to reduction of the polarization field shielding effect and the band filling suppressing effect. Excellent luminous efficiency and a low threshold current can be implemented due to the synergistic effects. Band filling can be further suppressed due to the low threshold current, whereby the laser oscillation wavelength can be rendered closer to the spontaneous emission peak wavelength. Thus, a long-wavelength laser can be implemented by further effectively suppressing a blueshift.

Preferably, the major growth surface is defined by an m-plane. A group III nitride semiconductor crystal having a major surface defined by an m-plane which is one of nonpolar planes is stably grown and has excellent crystallinity, whereby the luminous efficiency can be improved. Therefore, both of the polarization field shielding effect and the band filling can be suppressed, and a low threshold current can be implemented by the improvement of the luminous efficiency. Thus, a long-wavelength laser can be implemented by further effectively suppressing a blueshift.

Preferably, a cavity direction is a c-axis direction, and the cavity end faces are defined by c-planes formed by cleavage. According to the structure, excellent cavity end faces can be formed by forming stripes in the c-axis direction and performing cleavage along the c-planes.

Particularly when the major growth surface of the group III nitride semiconductor is defined by an m-plane, light emitted from the active layer is polarized in an a-axis direction, i.e., a direction parallel to the m-plane, and travels in the c-axis direction in the case of a TE mode. Therefore, laser oscillation can be caused by efficiently utilizing spontaneous emission contributing to the TE mode and a high gain is obtained by parallelizing the direction of the stripes, i.e., the direction of a wave guide with the c-axis direction corresponding to the traveling direction of the light. Thus, the threshold current for causing laser oscillation can be reduced, and a blueshift can be further reduced.

The embodiment of the present invention is now described in more detail with reference to the attached drawings.

Figure 2:
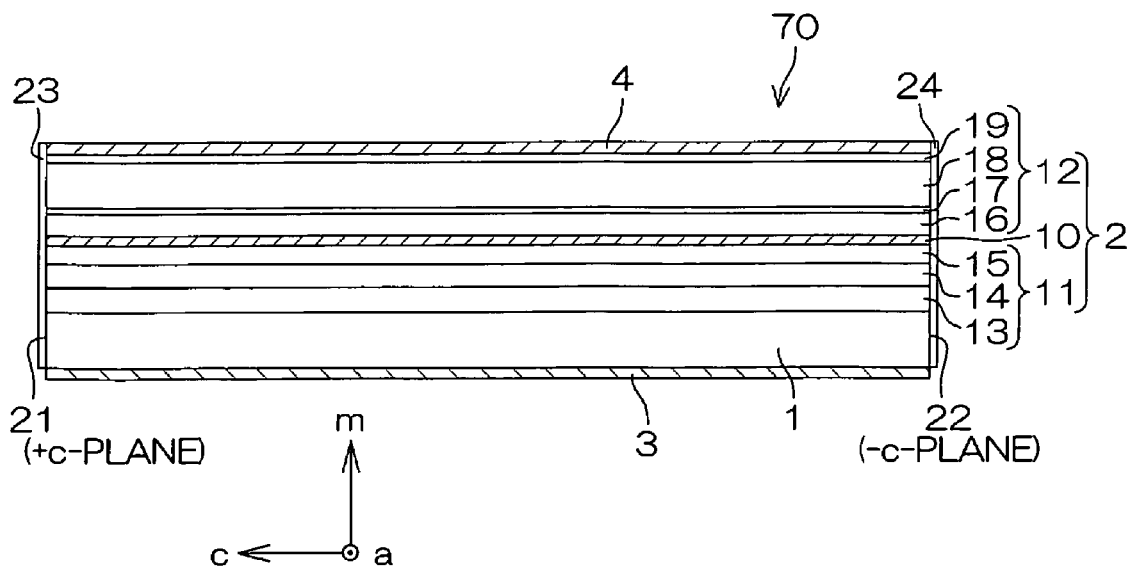
FIG. 2 is a longitudinal sectional view taken along a line II-II in FIG. 1.
Figure 3:
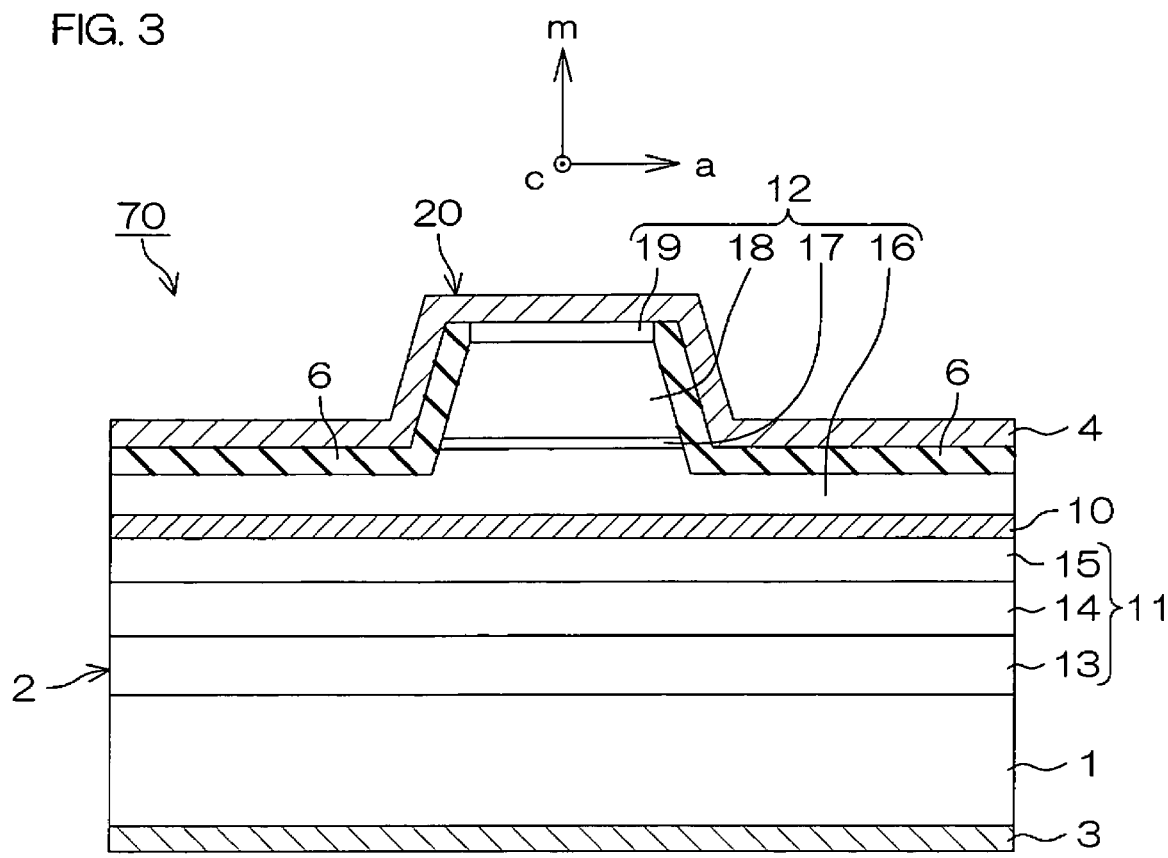
FIG. 3 is a cross sectional view taken along a line III-III in FIG. 1.

FIG. 1 is a perspective view for illustrating the structure of a semiconductor laser diode according to the embodiment of the present invention, FIG. 2 is a longitudinal sectional view taken along a line II-II in FIG. 1, and FIG. 3 is a cross sectional view taken along a line III-III in FIG. 1.

The semiconductor laser diode 70 is a Fabry-Perot laser diode including a substrate 1, a group III nitride semiconductor multilayer structure 2 formed on the substrate 1 by crystal growth, an n-type electrode 3 formed to be in contact with the rear surface of the substrate 1 (the surface opposite to the group III nitride semiconductor multilayer structure 2) and a p-type electrode 4 formed to be in contact with the surface of the group III nitride semiconductor multilayer structure 2.

The substrate 1 is constituted of a GaN monocrystalline substrate in the embodiment. The major surface of the substrate 1 is defined by an m-plane which is one of nonpolar planes, and the group III nitride semiconductor multilayer structure 2 is formed by crystal growth on the major surface. Therefore, the group III nitride semiconductor multilayer structure 2 is made of group III nitride semiconductors having major crystal growth surfaces defined by m-planes.

Layers forming the group III nitride semiconductor multilayer structure 2 are coherently grown with respect to the substrate 1. Coherent growth denotes crystal growth in a state keeping continuity of a lattice from an underlayer. Lattice mismatching with the underlayer is absorbed by strain of the lattice of the crystal-grown layer, and continuity of the lattice on the interface between the same and the underlayer is maintained. An a-axis lattice constant of InGaN in an unstrained state is greater than an a-axis lattice constant of GaN, and hence compressive stress (compressive strain) in an a-axis direction is applied to an InGaN layer. On the other hand, the a-axis lattice constant of AlGaN in an unstrained state is smaller than the a-axis lattice constant of GaN, and hence tensile stress (tensile strain) in the a-axis direction is applied to an AlGaN layer.

The group III nitride semiconductor multilayer structure 2 includes an active layer (light emitting layer) 10, an n-type semiconductor layered portion 11 and a p-type semiconductor layered portion 12. The n-type semiconductor layered portion 11 is disposed on a side of the active layer closer to the substrate 1, while the p-type semiconductor layered portion 12 is disposed on a side of the active layer closer to the p-type electrode 4. Thus, the active layer is held between the n-type semiconductor layered portion 11 and the p-type semiconductor layered portion 12, whereby a double heterojunction is provided. Electrons and positive holes are injected into the active layer 10 from the n-type semiconductor layered portion 11 and the p-type semiconductor layered portion 12 respectively. The electrons and the positive holes are recombined in the active layer 10, to emit light.

The n-type semiconductor layered portion 11 is formed by successively stacking an n-type GaN contact layer 13 (having a thickness of 2 μm, for example), an n-type AlGaN cladding layer 14 (having a thickness of not more than 1.5 μm such as a thickness of 1.0 μm, for example) and an n-type InGaN guide layer 15 (having a thickness of 0.1 μm, for example) from the side closer to the substrate 1. On the other hand, the p-type semiconductor layered portion 12 is formed by successively stacking a p-type InGaN guide layer 16 (having a thickness of 0.1 μm, for example), a p-type AlGaN electron blocking layer 17 (having a thickness of 20 nm, for example), a p-type AlGaN cladding layer 18 (having a thickness of not more than 1.5 μm such as a thickness of 0.4 μm, for example) and a p-type GaN contact layer 19 (having a thickness of 0.3 μm, for example) on the active layer 10.

The n-type GaN contact layer 13 is a low-resistance layer. The p-type GaN contact layer 19 is a low-resistance layer for attaining ohmic contact with the p-type electrode 4. The n-type GaN contact layer 13 is made of an n-type semiconductor prepared by doping GaN with Si, for example, serving as an n-type dopant in a high doping concentration ($3 \times 10^{18}$ cm$^{-3}$, for example). The p-type GaN contact layer 19 is made of a p-type semiconductor prepared by doping GaN with Mg serving as a p-type dopant in a high doping concentration ($3 \times 10^{19}$ cm$^{-3}$, for example).

The n-type AlGaN cladding layer 14 and the p-type AlGaN cladding layer 18 provide a light confining effect confining the light emitted by the active layer 10 therebetween. The n-type AlGaN cladding layer 14 is made of an n-type semiconductor prepared by doping AlGaN with Si, for example, serving as an n-type dopant (in a doping concentration of $1 \times 10^{18}$ cm$^{-3}$, for example). The p-type AlGaN cladding layer 18 is made of a p-type semiconductor prepared by doping AlGaN with Mg serving as a p-type dopant (in a doping concentration of $1 \times 10^{19}$ cm$^{-3}$, for example). The band gap of the n-type AlGaN cladding layer 14 is wider than that of the n-type InGaN guide layer 15, and the band gap of the p-type AlGaN cladding layer 18 is wider than that of the p-type InGaN guide layer 16. Thus, the light can be excellently confined, and a semiconductor laser diode having a low threshold and high efficiency can be implemented.

When the emission wavelength of the active layer 10 is set in a long wave range of not less than 450 nm, the n-type AlGaN cladding layer 14 and the p-type AlGaN cladding layer 18 are preferably constituted of AlGaN having an average Al composition of not more than 5%. Thus, excellent light confinement can be implemented. The cladding layers 14 and 18 can also be constituted of super lattice structures of AlGaN layers and GaN layers. Also in this case, the average Al composition in the overall cladding layers 14 and 18 is preferably set to not more than 5%.

The n-type InGaN guide layer 15 and the p-type InGaN guide layer 16 are semiconductor layers providing a carrier confining effect for confining carriers (electrons and positive holes) in the active layer 10, and form a light confining structure in the active layer 10 along with the cladding layers 14 and 18. Thus, the efficiency of recombination of the electrons and the positive holes in the active layer 10 is improved. The n-type InGaN guide layer 15 is made of an n-type semiconductor prepared by doping InGaN with Si, for example, serving as an n-type dopant (in a doping concentration of $1 \times 10^{18}$ cm$^{-3}$, for example), while the p-type InGaN guide layer 16 is made of a p-type semiconductor prepared by doping InGaN with Mg, for example, serving as a p-type dopant (in a doping concentration of 5×10$^{18}$ cm$^{-3}$, for example).

The p-type AlGaN electron blocking layer 17 is made of a p-type semiconductor prepared by doping AlGaN with Mg, for example, serving as a p-type dopant (in a doping concentration of 5×10$^{18}$ cm$^{-3}$, for example), and improves the efficiency of recombination of the electrons and the positive holes by preventing the electrons from flowing out of the active layer 10.

The active layer 10, having an MQW (multiple-quantum well) structure containing InGaN, for example, is a layer for emitting light by recombination of the electrons and the positive holes and amplifying the emitted light.

Figure 4:
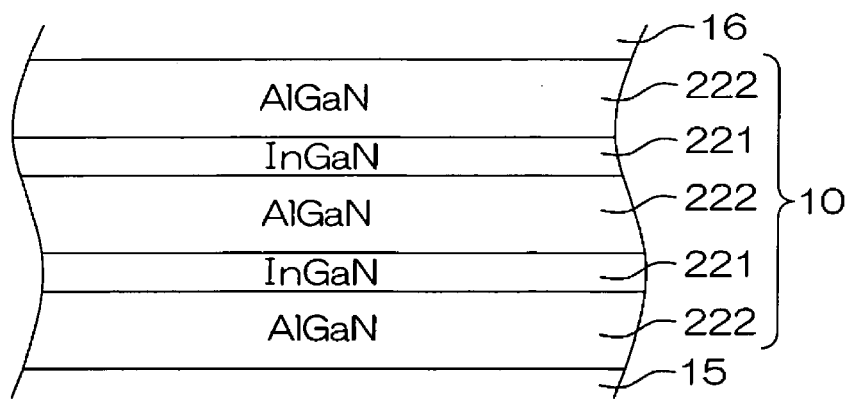
FIG. 4 is a schematic sectional view for illustrating the structure of a light emitting layer of the semiconductor laser diode.

According to the embodiment, the active layer 10 has a multiple-quantum well (MQW) structure formed by alternately repetitively stacking quantum well layers (each having a thickness of 1 nm, for example) 221 consisting of InGaN layers and barrier layers 222 consisting of AlGaN layers by a plurality of cycles, as shown in FIG. 4. In this case, the In composition ratio in each quantum well layer 221 made of InGaN is set to not less than 5%, whereby the quantum well layer 221 has a relatively small band gap while each barrier layer 222 made of AlGaN has a relatively large band gap. The quantum well layers 221 and the barrier layers 222 are alternately repetitively stacked by two to seven cycles, for example, to constitute the active layer 10 having the multiple-quantum well structure. The emission wavelength corresponds to the band gap of the quantum well layers 221, and the band gap can be adjusted by adjusting the composition ratio of indium (In). The band gap is reduced and the emission wavelength is increased as the composition ratio of indium is increased. According to the embodiment, the emission wavelength is set to 450 nm to 550 nm by adjusting the composition of In in the quantum well layers (InGaN layers) 221. In the multiple-quantum well structure, the number of the quantum well layers 221 containing In is preferably set to not more than three.

The thickness of each barrier layer 222 is set to 3 nm to 8 nm (7 nm, for example). Thus, the average refractive index around the active layer 10 can be increased, whereby an excellent light confining effect is attained and a low threshold current can be implemented. For example, a threshold current of not more than 100 mA serving as a criterion for continuous-wave oscillation can be implemented. The function of the barrier layer 222 is hard to obtain if the thickness of the barrier layer 222 is less than 3 nm, while the light confining effect around the active layer 10 may be weakened to cause difficulty in continuous-wave oscillation if the thickness of the barrier layer 222 exceeds 8 nm.

In order to further increase the average refractive index around the active layer 10 for more strongly confining the light, the Al composition in each barrier layer 222 is preferably set to not more than 5%.

As shown in FIG. 1 etc., the p-type semiconductor layered portion 12 is partially removed, to form a ridge stripe 20. More specifically, the p-type GaN contact layer 19, the p-type AlGaN cladding layer 18, the p-type AlGaN electron blocking layer 17 and the p-type InGaN guide layer 16 are partially removed by etching, to form the ridge stripe 20 having a generally trapezoidal shape (mesa shape) in cross sectional view. The ridge stripe 20 is formed along the c-axis direction. The group III nitride semiconductor multilayer structure 2 has a pair of end faces 21 and 22 (cleavage planes) formed by cleaving both ends of the ridge stripe 20 in the longitudinal direction. The pair of end faces 21 and 22 are parallel to each other, and perpendicular to c-axis. Thus, the n-type InGaN guide layer 15, the active layer 10 and the p-type InGaN guide layer 16 form a Fabry-Perot cavity with the end faces 21 and 22 serving as cavity end faces. In other words, the light emitted in the active layer 10 reciprocates between the cavity end faces 21 and 22, and is amplified by induced emission. The amplified light is partially extracted from the cavity end faces 21 and 22 as laser beams.

The n-type electrode 3 and the p-type electrode 4, made of an Al metal, for example, are in ohmic contact with the p-type GaN contact layer 19 and the substrate 1 respectively. Insulating layers 6 covering exposed surfaces of the p-type InGaN guide layer 16, the p-type AlGaN electron blocking layer 17 and the p-type AlGaN cladding layer 18 are so provided that the p-type electrode 4 is in contact with only the p-type GaN contact layer 19 provided on the top face (a striped contact region) of the ridge stripe 20. Thus, a current can be concentrated on the ridge stripe 20, thereby enabling efficient laser oscillation. Regions of the surface of the ridge stripe 20 excluding the portion in contact with the p-type electrode 4 are covered with the insulating layers 6, whereby control can be simplified by moderating lateral light confinement and leakage currents from the side surfaces can be prevented. The insulating layers 6 can be made of an insulating material such as SiO$_2$ or ZrO$_2$, for example, having a refractive index greater than 1.

The top face of the ridge stripe 20 is defined by an m-plane, and the p-type electrode 4 is formed on the m-plane. The rear surface of the substrate 1 provided with the n-type electrode 3 is also defined by an m-plane. Thus, both of the p-type electrode 4 and the n-type electrode 3 are formed on the m-planes, whereby reliability for sufficiently withstanding increase in the laser output and a high-temperature operation can be implemented.

The cavity end faces 21 and 22 are covered with insulating films 23 and 24 (not shown in FIG. 1) respectively. The cavity end face 21 is a +c-axis-side end face, and the cavity end face 22 is a −c-axis-side end face. In other words, the crystal plane of the cavity end face 21 is a +c-plane, and that of the cavity end face 22 is a −c-plane. The insulating film 24 provided on the −c-plane-side can function as a protective film protecting the chemically weak −c-plane dissolved in alkali, and contributes to improvement in the reliability of the semiconductor laser diode 70.

Figure 5:
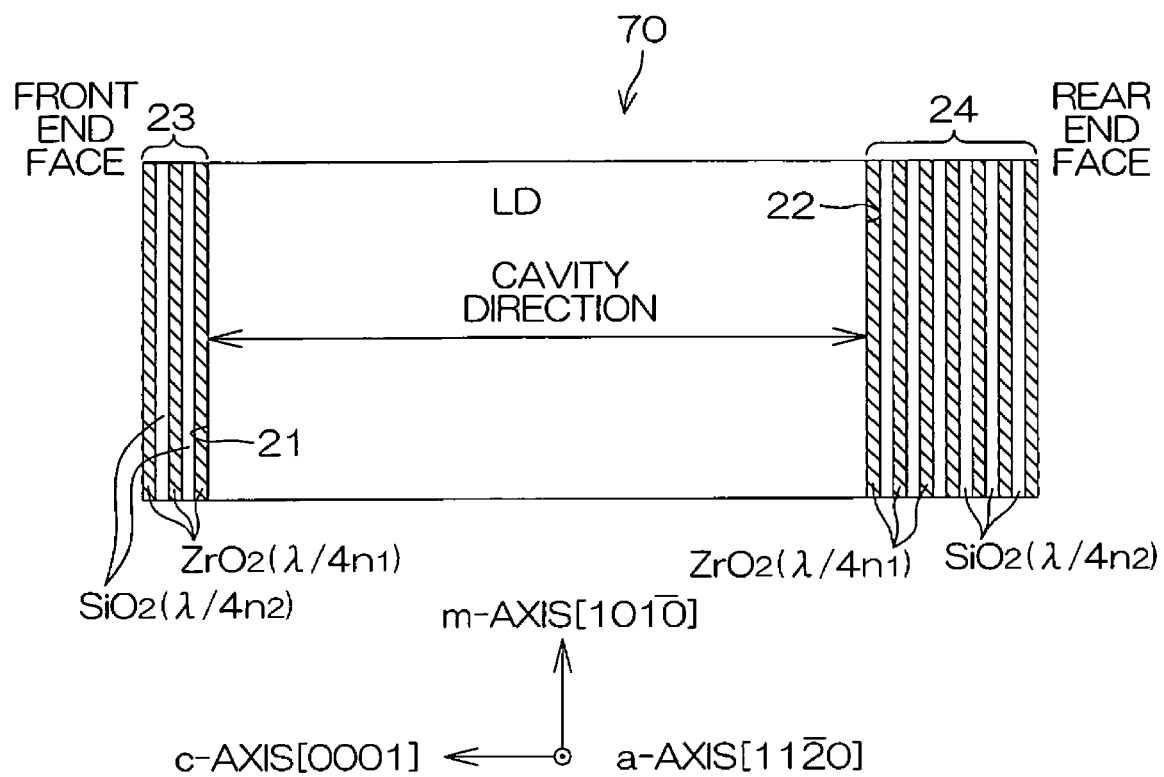
FIG. 5 is a schematic diagram for illustrating the structures of insulating films (reflecting films) formed on cavity end faces.

As schematically shown in FIG. 5, the insulating films 23 and 24 covering the cavity end faces 21 and 22 are formed by distributed Bragg reflectors (DBR) coating the end faces 21 and 22. More specifically, each of the insulating films 23 and 24 is constituted of a multiple reflection film formed by alternately repetitively stacking ZrO$_2$ films and SiO$_2$ films a plurality of times, for example. More specifically, the insulating film 23 covering the cavity end face 21 is a multiple reflection film formed by alternately stacking five ZrO$_2$ and SiO$_2$ films in total, for example. The insulating film 24 covering the cavity end face 22 is a multiple reflection film formed by alternately stacking 13 ZrO$_2$ and SiO$_2$ films in total. Both of the cavity end faces 21 and 22 are in contact with ZrO$_2$ films. Assuming that $\lambda_c$ represents the central wavelength of a target reflectance spectrum, the thickness of each ZrO$_2$ film is set to $\lambda_c/4n_1$ (where $n_1$ represents the refractive index of ZrO$_2$. $n_1$=2.08), and the thickness of each SiO$_2$ film is set to $\lambda_c/4n_2$ (where $n_2$ represents the refractive index of SiO$_2$. $n_2$=1.45). Assuming that $\lambda_c$=460 nm, the thickness of each ZrO$_2$ film is 55 nm, and the thickness of each SiO$_2$ film is 79 nm.

According to such a structure, the reflectance on the +c-axis-side end face 21 is small, and that on the −c-axis-side end face 22 is large. More specifically, the reflectance on the +c-axis-side end face 21 is about 69% (in the case of alternately stacking five $ZrO_2$ and $SiO_2$ films in total), and the reflectance on the −c-axis-side end face 22 is about 99% (in the case of alternately stacking 13 $ZrO_2$ and $SiO_2$ films in total), for example. Therefore, the +c-axis-side end face 21 outputs a larger laser output. In other words, the +c-axis-side end face 21 serves as a laser emitting end face in the semiconductor laser diode 70.

According to the structure, light having a wavelength of 450 nm to 550 nm can be emitted by connecting the n-type electrode 3 and the p-type electrode 4 to a power source and injecting the electrons and the positive holes into the active layer 10 from the n-type semiconductor layered portion 11 and the p-type semiconductor layered portion 12 respectively thereby recombining the electrons and the positive holes in the active layer 10. The light reciprocates between the cavity end faces 21 and 22 along the guide layers 15 and 16, and is amplified by induced emission. Then, a larger quantity of laser output is extracted from the cavity end face 21 serving as the laser emitting end face.

Figure 6:
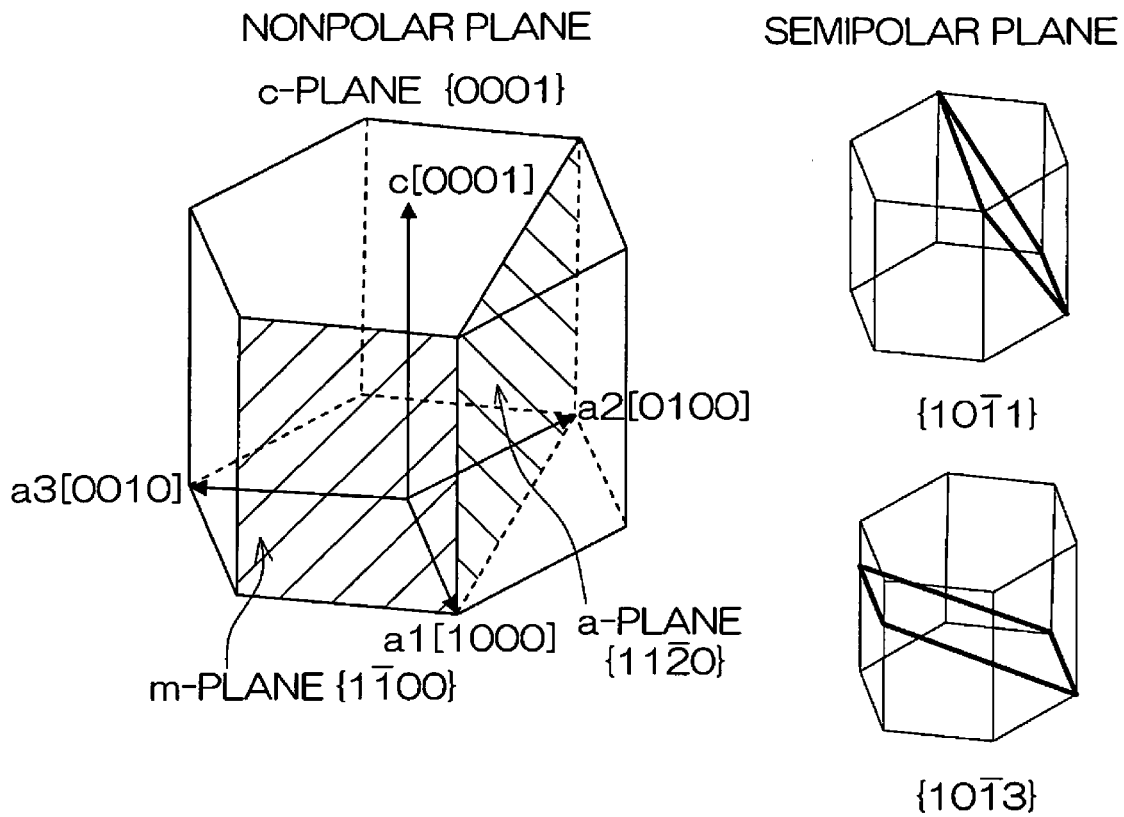
FIG. 6 is a schematic diagram showing a unit cell of the crystal structure of a group III nitride semiconductor.
Figure 6:
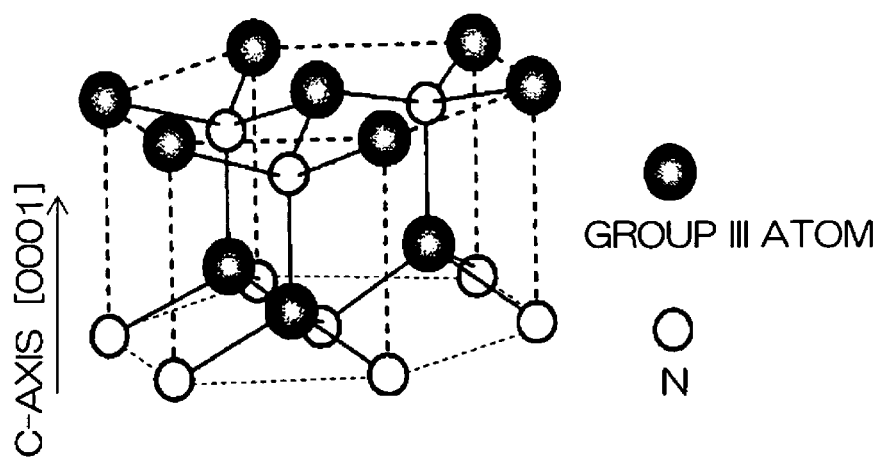

FIG. 6 is a schematic diagram showing a unit cell of the crystal structure of a group III nitride semiconductor. The crystal structure of the group III nitride semiconductor can be approximated by a hexagonal system, and four nitrogen atoms are bonded to each group III atom. The four nitrogen atoms are located on four vertices of a regular tetrahedron having the group III atom disposed at the center thereof. One of the four nitrogen atoms is located in a +c-axis direction of the group III atom, while the remaining three nitrogen atoms are located on a −c-axis side of the group III atom. Due to the structure, the direction of polarization of the group III nitride semiconductor is along the c-axis.

The c-axis is along the axial direction of a hexagonal prism, and a surface (the top face of the hexagonal prism) having the c-axis as a normal is a c-plane (0001). When a crystal of the group III nitride semiconductor is cleaved along two planes parallel to the c-plane, group III atoms align on the crystal plane (+c-plane) on the +c-axis side, and nitrogen atoms align on the crystal plane (−c-plane) on the −c-axis side. Therefore, the c-planes, exhibiting different properties on the +c-axis side and the −c-axis side, are called polar planes.

The +c-plane and the −c-plane are different crystal planes, and hence responsively exhibit different physical properties. More specifically, it has been recognized that the +c-plane has high durability against chemical reactivity such as high resistance against alkali, while the −c-plane is chemically weak and dissolved in alkali, for example.

On the other hand, the side surfaces of the hexagonal prism are defined by m-planes (10-10) respectively, and a surface passing through a pair of un adjacent ridges is defined by an a-plane (11-20). The planes, which are crystal planes perpendicular to the c-planes and orthogonal to the direction of polarization, are planes having no polarity, i.e., nonpolar planes. Crystal planes inclined (neither parallel nor perpendicular) with respect to the c-planes, obliquely intersecting with the direction of polarization, are planes having slight polarity, i.e., semipolar planes. Specific examples of the semipolar planes area (10-1-1) plane, a (10-1-3) plane, a (11-22) plane and the like.

T. Takeuchi et al., Jap. J. Appl. Phys. 39, 413-416, 2000 describes the relation between angles of deviation of crystal planes with respect to c-planes and polarization of the crystal planes in normal directions. From the document, it can be said that a (11-24) plane, a (10-12) plane etc. are also less polarized and powerful crystal planes employable for extracting largely polarized light.

For example, a GaN monocrystalline substrate having a major surface defined by an m-plane can be cut out of a GaN monocrystal having a major surface defined by a c-plane. The m-plane of the cut substrate is polished by chemical mechanical polishing, for example, so that azimuth errors with respect to both of a (0001) direction and a (11-20) direction are within ±1° (preferably within ±0.3°). Thus, a GaN monocrystalline substrate having a major surface defined by an m-plane is obtained with no crystal defects such as dislocations and stacking faults. Only steps of an atomic level are formed on the surface of the GaN monocrystalline substrate.

The group III nitride semiconductor multilayer structure 2 constituting a semiconductor laser diode structure is grown on the GaN monocrystalline substrate obtained in the aforementioned manner by metal-organic chemical vapor deposition.

When the group III nitride semiconductor multilayer structure 2 having the major growth surface defined by an m-plane is grown on the GaN monocrystalline substrate 1 having the major surface defined by an m-plane and a section along an a-plane is observed with an electron microscope (STEM: scanning transmission electron microscope), no striation showing the presence of dislocations is observed in the group III nitride semiconductor multilayer structure 2. When the surface state is observed with an optical microscope, it is understood that planarity in a c-axis direction (the difference between the heights of a terminal portion and a lowermost portion) is not more than 10 Å. This means that planarity of the active layer 10, particularly the quantum well layers, in the c-axis direction is not more than 10 Å, and the half band width of an emission spectrum can be reduced.

Thus, dislocation-free m-plane group III nitride semiconductors having planar stacking interfaces can be grown. However, the offset angle of the major surface of the GaN monocrystalline substrate 1 is preferably set within ±1° (preferably within ±0.3°). If GaN semiconductor layers are grown on an m-plane GaN monocrystalline substrate having an offset angle set to 2°, for example, GaN crystals may be grown in the form of terraces and a planar surface state may not be obtained dissimilarly to the case of setting the offset angle within ±1°.

Group III nitride semiconductors crystal-gown on the GaN monocrystalline substrate having the major surface defined by an m-plane are grown with major growth surfaces defined by m-planes. If the group III nitride semiconductors are crystal-grown with major surfaces defined by c-planes, luminous efficiency in the active layer 10 may be deteriorated due to influence by polarization in the c-axis direction. When the major growth surfaces are defined by m-planes, on the other hand, polarization in the quantum well layers is suppressed, and the luminous efficiency is increased. Thus, reduction of a threshold and increase in slope efficiency can be implemented. Current dependency of the emission wavelength is suppressed due to small polarization, and a stable oscillation wavelength can be implemented.

Further, anisotropy in physical properties is caused in the c-axis direction and the a-axis direction due to the major surfaces defined by m-planes. In addition, biaxial stress resulting from lattice strain is caused in the active layer 10 containing In. Consequently, a state density in an edge of a valence band is reduced as compared with a case where the major surfaces are defined by c-planes, whereby population inversion is easily caused, a gain is enhanced, and laser characteristics are improved.

The major surfaces of crystal growth are so defined by m-planes that group III nitride semiconductor crystals can be extremely stably grown, and crystallinity can be further improved as compared with a case of defining the major crystal growth surfaces by c-planes or a-planes. Thus, a high-performance laser diode can be prepared.

The active layer 10 is formed by group III nitride semiconductors grown with major crystal growth surfaces defined by m-planes, and hence the light emitted from the active layer 10 is polarized in an a-axis direction, i.e., a direction parallel to the m-planes, and travels in a c-axis direction in the case of a TE mode. Therefore, the major crystal growth surface of the semiconductor laser diode 70 is parallel to the direction of polarization, and a stripe direction, i.e., the direction of a waveguide is set parallel to the traveling direction of the light. Thus, oscillation of the TE mode can be easily caused, and a threshold current for causing laser oscillation can be reduced.

According to the embodiment, a GaN monocrystalline substrate is employed as the substrate 1, whereby the group III nitride semiconductor multilayer structure 2 can have high crystal quality with a small number of defects. Consequently, a high-performance laser diode can be implemented.

Further, the group III nitride semiconductor multilayer structure 2 grown on the GaN monocrystalline substrate having generally no dislocations can be formed by excellent crystals having neither stacking faults nor threading dislocations from a regrowth surface (m-plane) of the substrate 1. Thus, characteristic deterioration such as reduction in luminous efficiency resulting from defects can be suppressed.

Figure 7:
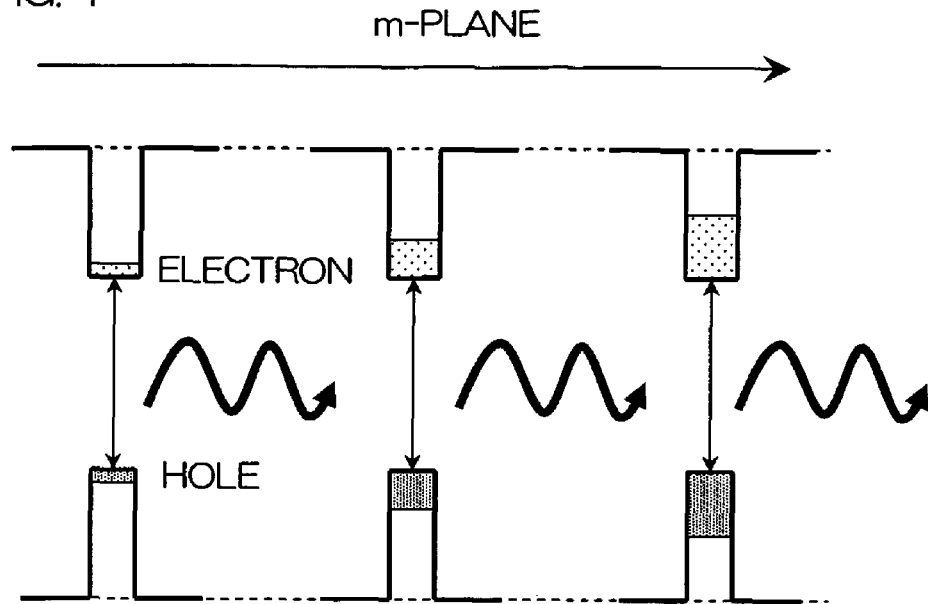
FIG. 7 is a diagram for illustrating the band structure of a quantum well layer.
Figure 15:
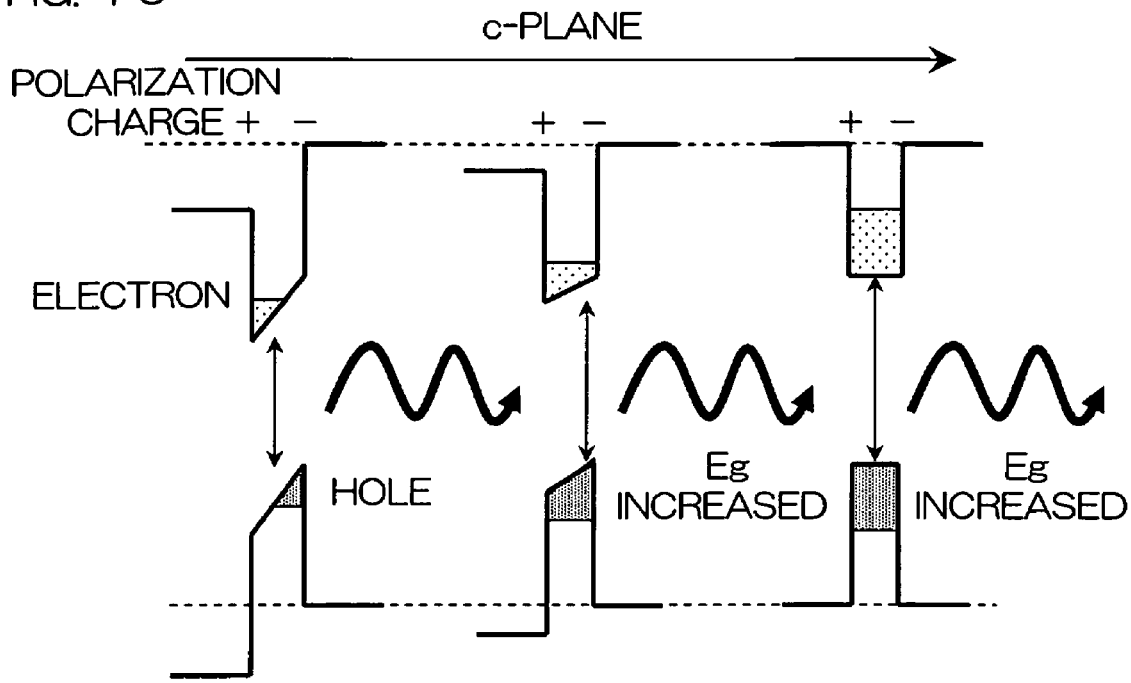
FIG. 15 is a diagram for illustrating the principle of a blueshift resulting from a polarization field in a c-plane laser diode.

FIG. 7 is a diagram for illustrating the band structure of each quantum well layer 221 (see FIG. 4). In a quantum well layer having a major growth surface defined by a nonpolar m-plane, no bend of a band resulting from spontaneous piezo-electric polarization is caused. If a current density is increased for laser oscillation (the center and the right side in FIG. 7), therefore, no shielding of a polarization field (see FIG. 15) is caused by carriers, whereby no change in an energy gap Eg is caused. Therefore, no blueshift resulting from shielding of the polarization field is caused.

Figure 8:
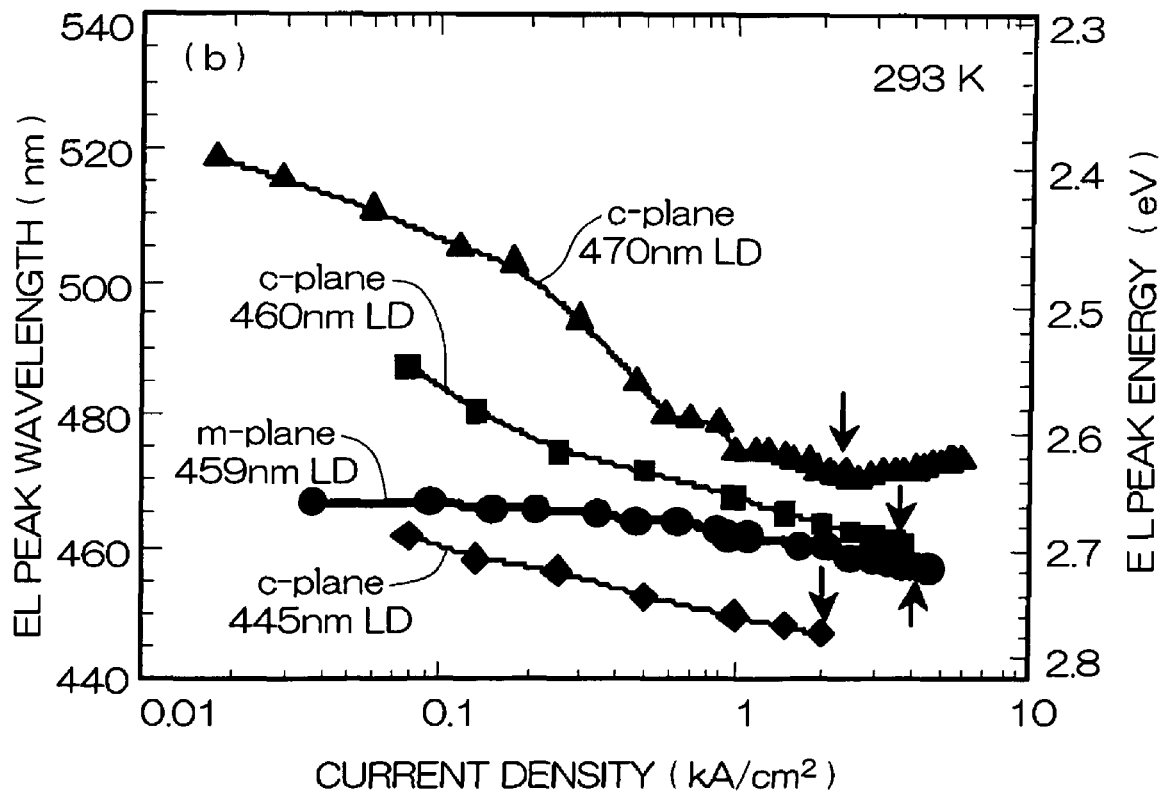
FIG. 8 is a graph showing results of investigation of EL peak wavelengths at various current densities as to a c-plane laser diode and an m-plane laser diode.

FIG. 8 is a graph showing results of investigation of EL (Electro-Luminescence) peak wavelengths (in one-to-one correspondence to EL peak energy values) at various current densities as to a laser diode (a c-plane laser diode) having a major growth surface defined by a c-plane and a laser diode (an m-plane laser diode) having a major growth surface defined by an m-plane. Arrow on each curve denotes a current density (a threshold current density) causing laser oscillation, and the emission wavelength at this time is shown in FIG. 8. The left side of arrow is a spontaneous emission region, and the right side of arrow is a laser oscillation region.

In the c-plane laser diode, the emission wavelength is reduced following increase in the current density due to a blueshift, and the peak wavelength in the laser oscillation region is considerably shorter than that of spontaneous emission. This tendency more remarkably appears in the long-wavelength c-plane laser diode. This is the blueshift resulting from shielding of the polarization field.

On the other hand, it is understood that change in the emission wavelength following increase in the current density is small and the emission peak wavelengths are not much different from each other in the spontaneous emission region and the laser oscillation region in the m-plane laser diode. This is because no blueshift results from shielding of a polarization field in the m-plane laser diode, as hereinabove described.

Figure 9:
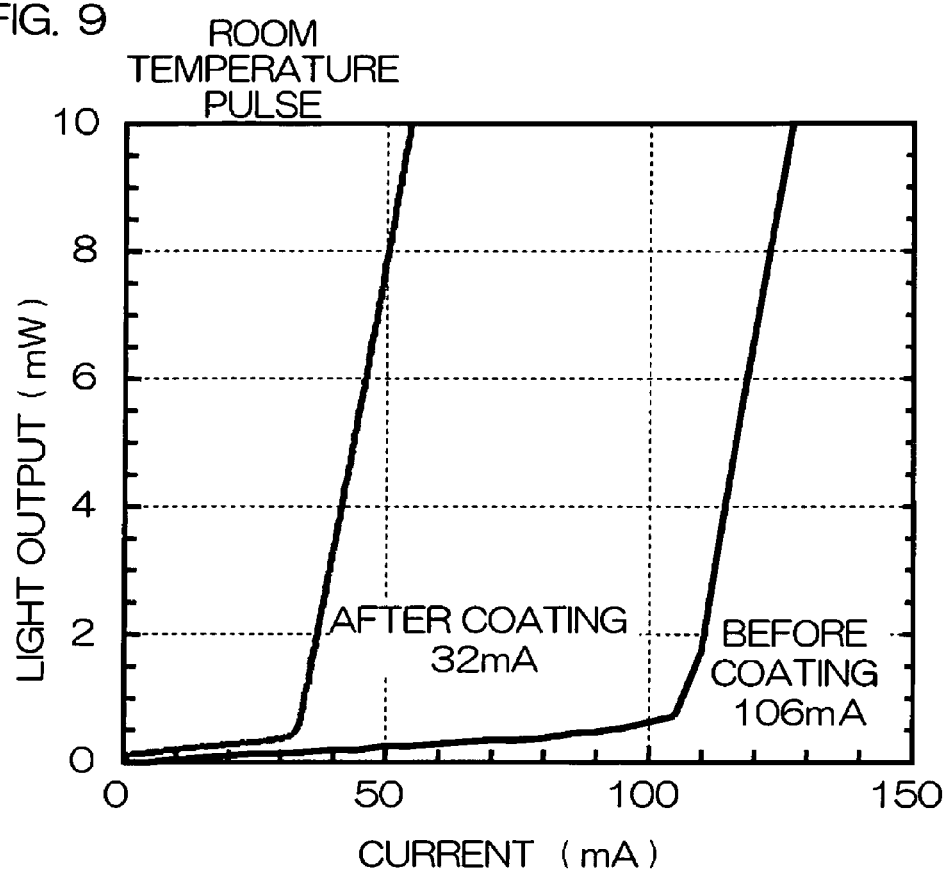
FIG. 9 is a diagram for illustrating an effect of reducing a threshold current by cavity end face coating.
Figure 10:
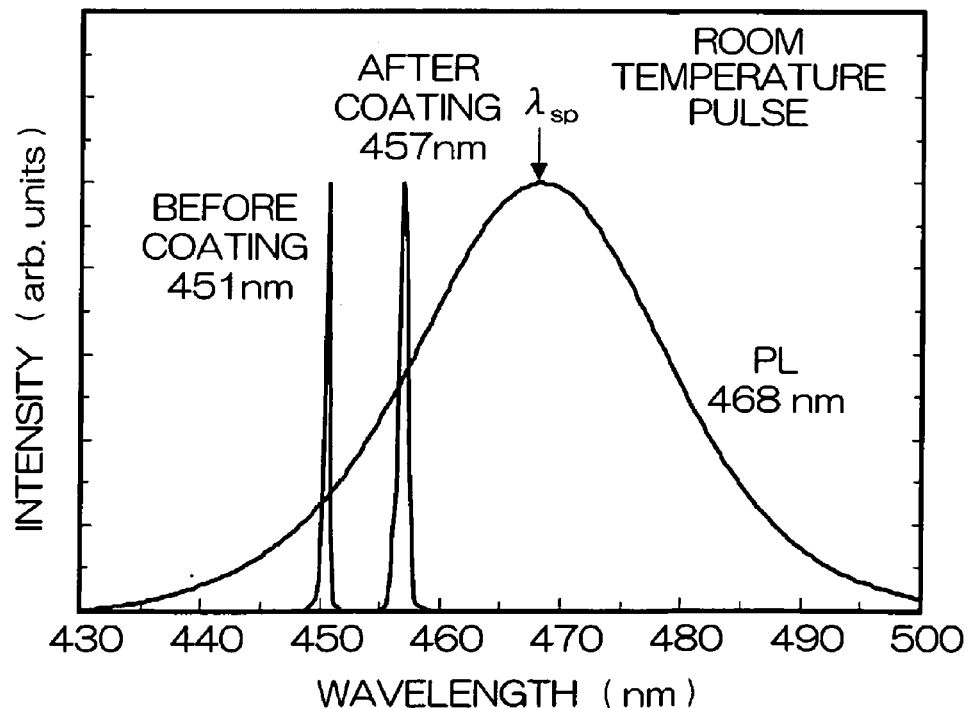
FIG. 10 is a diagram for illustrating wavelength elongation in a laser oscillation frequency resulting from the cavity end face coating.

FIG. 9 is a diagram for illustrating an effect of reducing the threshold current by cavity end face coating, and FIG. 10 is a diagram for illustrating wavelength elongation in a laser oscillation frequency resulting from the cavity end face coating. A semiconductor laser diode 70 having an emission peak wavelength $\lambda_{SP}$ of spontaneous emission of 468 nm was prepared, and light outputs (FIG. 9) and spectra of an emission wavelength (FIG. 10) were investigated before and after coating cavity end faces 21 and 22 thereof with insulating films 23 and 24 formed by the aforementioned distributed Bragg reflectors. In this case, the emission peak wavelength $\lambda_{SP}$ of the spontaneous emission is a photoluminescence (PL) peak wavelength in a case of weakly exciting an active layer 10 at an excitation density of not more than 30 W/cm². Each of the distributed Bragg reflectors coating the cavity end faces 21 and 22 was designed so that the central wavelength $\lambda_c$ of a reflectance spectrum was 460 nm, the emitting-side cavity end face 21 was coated with a distributed Bragg reflector formed by alternately stacking five $ZrO_2$ and $SiO_2$ films in total, and the reflecting cavity end face 22 was coated with a distributed Bragg reflector formed by alternately stacking 13 $ZrO_2$ and $SiO_2$ films in total.

It is understood from FIG. 9 that the threshold current was reduced from 106 mA to 32 mA due to the coatings on the cavity end faces. Referring also to FIG. 8, it is understood that a blueshift can be suppressed by reducing the threshold current. As shown in FIG. 10, the laser oscillation wavelength before the cavity end face coating was 451 nm while that after the cavity end face coating was 457 nm, and it is understood that the laser oscillation wavelength approached the emission peak wavelength $\lambda_{SP}$ of the spontaneous emission.

Figure 16:
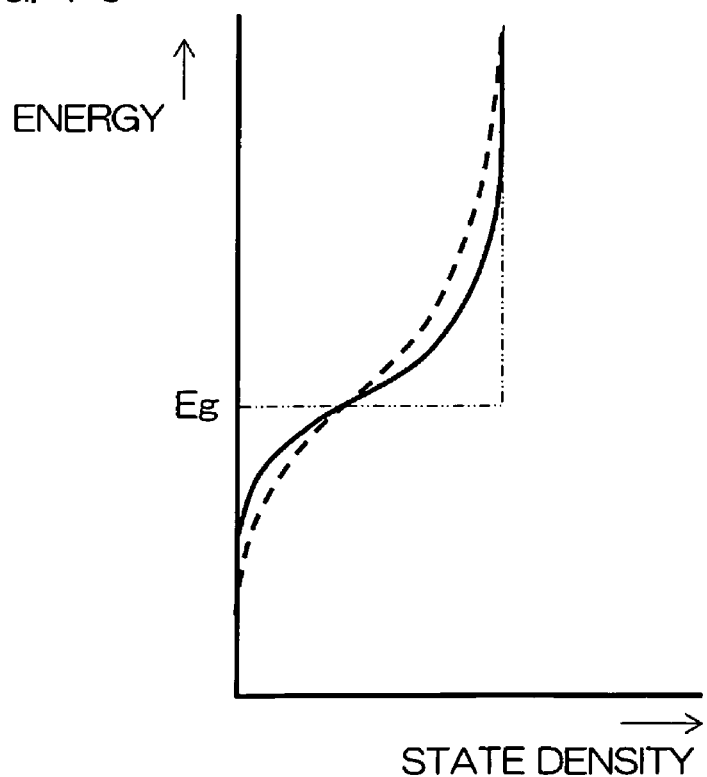
FIG. 16 is a diagram for illustrating a blueshift resulting from band filling.

The main cause for the blueshift in the m-plane laser diode is band filling to a band tail (see FIG. 16). The central wavelength $\lambda_c$ of the reflectance spectrum is set to the value close to the emission peak wavelength $\lambda_{SP}$ of the spontaneous emission in each of the distributed Bragg reflectors formed on the cavity end faces, whereby induced emission at a wavelength close to the wavelength $\lambda_{SP}$ is prompted. Thus, the threshold current can be reduced by suppressing band filling from spontaneous emission to laser oscillation, whereby laser oscillation at a wavelength close to the emission peak wavelength $\lambda_{SP}$ of the spontaneous emission can be implemented. In other words, long-wavelength laser oscillation can be attained by suppressing a blueshift resulting from band filling.

Figure 11:
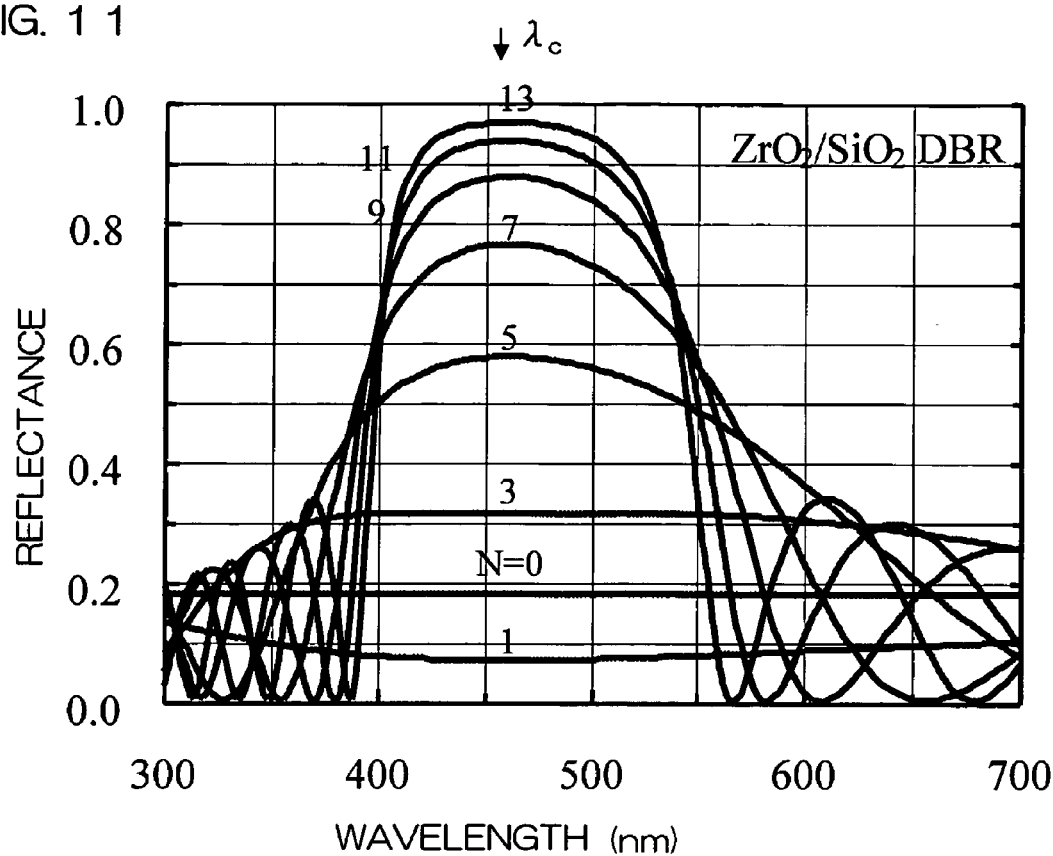
FIG. 11 is a diagram showing reflectance spectra of distributed Bragg reflectors formed on the cavity end faces.
Figure 12:
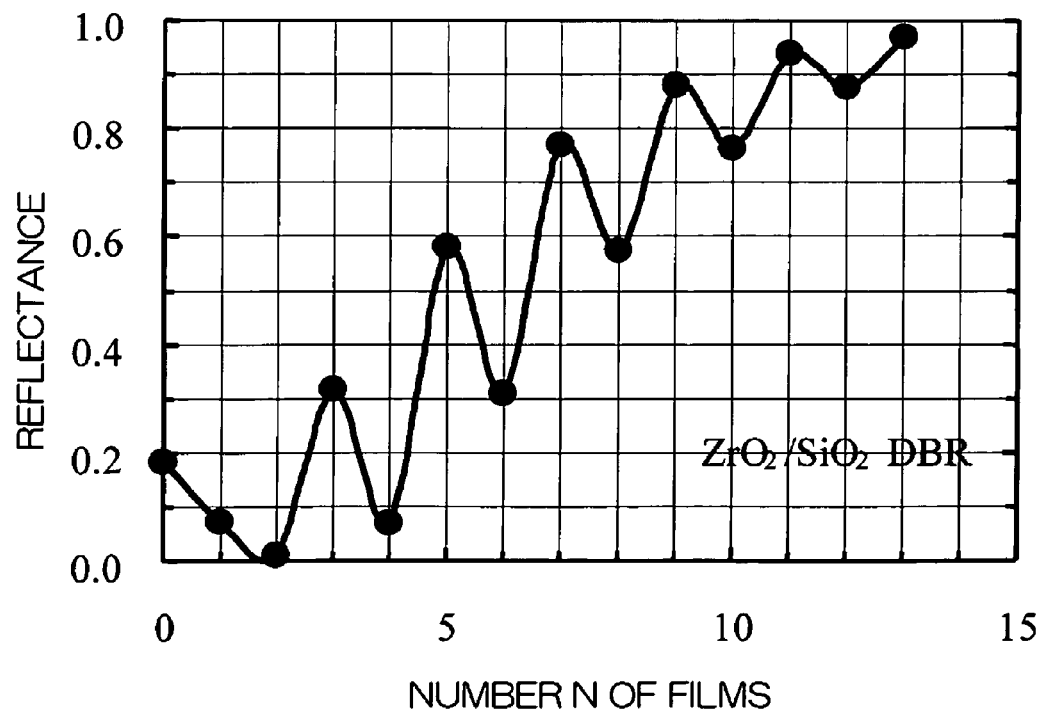
FIG. 12 is a diagram showing the relation between the number of films of the distributed Bragg reflector and reflectance at a central wavelength.

FIG. 11 is a diagram showing the reflectance spectra of the distributed Bragg reflectors (the insulating films 23 and 24) formed on the cavity end faces 21 and 22. The central wavelengths $\lambda_c$ of the reflectance spectra are 460 nm, and it is understood that reflectance close to that at the central wavelengths $\lambda_c$ is attained in a wide wave range of about $\lambda_c-40$ nm to $\lambda_c+40$ nm. It is also understood that the reflectance is increased as the number N of films is increased in a region where the total number N (N=0, 1, 2, ... ) of $ZrO_2$ and $SiO_2$ films is not less than three (when N is an odd number). FIG. 12 shows the relation between the number N of films and the reflectance at the central wavelength $\lambda_c$. High reflectance is obtained by selecting an odd number as the number N of films.

Figure 13:
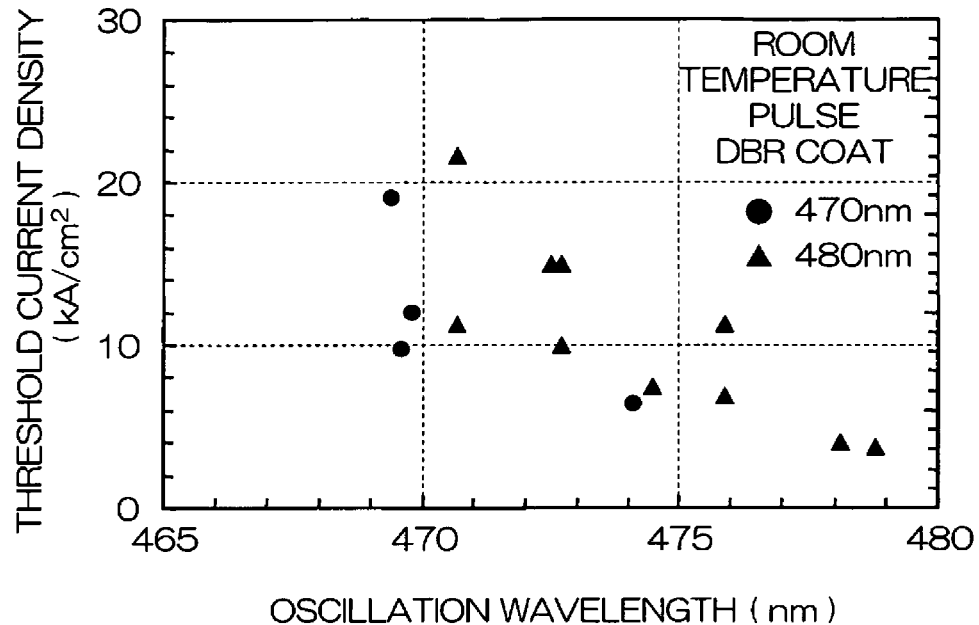
FIG. 13 is a diagram showing results of investigating influences exerted by central wavelengths of reflectance spectra on laser oscillation wavelengths.

FIG. 13 is a diagram showing results of investigating influences exerted by central wavelengths of reflectance spectra on laser oscillation wavelengths. Symbols "●" denote results of investigating the relation between oscillation wavelengths and threshold current densities as to a plurality of samples having cavity end faces coated with distributed Bragg reflectors so designed that central wavelengths $\lambda_c$ were 470 nm. Symbols "▲" denote results of investigating the relation between oscillation wavelengths and threshold current densities as to a plurality of samples having cavity end faces coated with distributed Bragg reflectors so designed that central wavelengths $\lambda_c$ were 480 nm. The emission peak wavelength $\lambda_{SP}$ of spontaneous emission is 494 nm.

It is understood from FIG. 13 that reduction of the threshold current density and elongation of the oscillation wavelength can be implemented by setting the central wavelength $\lambda_c$ of a reflectance spectrum to a long wave side close to the emission peak wavelength $\lambda_{SP}$ of the spontaneous emission.

According to the embodiment, as hereinabove described, a laser cavity is formed by the group III nitride semiconductor multilayer structure 2 having the major growth surfaces defined by m-planes, thereby suppressing a blueshift resulting from shielding of a polarization field. Further, the central wavelengths $\lambda_c$ of the reflectance spectra of the distributed Bragg reflectors formed on the cavity end faces 21 and 22 are set to the values close to the emission peak wavelength $\lambda_{SP}$ of the spontaneous emission in the active layer 10. Thus, elongation of the oscillation wavelength is implemented by suppressing a high-energy shift resulting from band filling. More specifically, a wavelength shift from the emission peak wavelength $\lambda_{SP}$ of the spontaneous emission can be reduced to not more than 10 nm, and long-wavelength laser oscillation can be implemented.

The central wavelengths $\lambda_c$ of the reflectance spectra of the distributed Bragg reflectors formed on the cavity end faces 21 and 22 are set in the range of $\lambda_{SP}-10$ nm $\leq \lambda_c \leq \lambda_{SP}+10$ nm, to effectively reduce a high-energy shift resulting from band filling. The laser oscillation wavelength is slightly shorter than the emission peak wavelength $\lambda_{SP}$ of the spontaneous emission, and hence the distributed Bragg reflectors are preferably designed to satisfy $\lambda_{SP}-5$ nm $\leq \lambda_c \leq \lambda_{SP}$, so that a blueshift resulting from band filling can be more effectively suppressed.

As the emission peak wavelength $\lambda_{SP}$ of the spontaneous emission when designing the distributed Bragg reflectors, a photoluminescence peak wavelength under weak excitation (an excitation density of not more than 30 W/cm$^2$) may be employed, while a peak wavelength (see FIG. 8) of a current injection spectrum at a current density of not more than 0.1 kA/cm$^2$ (more preferably, not more than 500 µA/cm$^2$) may also be employed.

According to the embodiment, the group III nitride semiconductor multilayer structure 2 constituting the laser cavity is made of the group III nitride semiconductors having excellent crystallinity with the major growth surfaces defined by m-planes, and the thickness of each quantum well layer 221 forming the active layer 10 is set to not more than 100 Å to cause a quantum effect. Further, the oscillation efficiency is improved also by setting the cavity direction to the c-axis direction. Thus, the threshold current is further reduced, and a blueshift is further suppressed in response thereto.

According to the embodiment, the active layer 10 has the multiple-quantum well structure formed by alternately stacking the quantum well layers 221 consisting of InGaN layers and the barrier layers 222 consisting of AlGaN layers, as hereinabove described. The layers constituting the group III nitride semiconductor multilayer structure 2 are coherently grown with respect to the substrate 1 having a major surface of an m-plane. In relation to the a-axis direction, therefore, compressive strain is caused in the InGaN layers, and tensile strain is caused in the AlGaN layers. In the active layer 10, however, the InGaN layers and the AlGaN layers are alternately stacked, whereby the compressive stress applied to the quantum well layers 221 consisting of the InGaN layers is relaxed by the barrier layers 222 consisting of the AlGaN layers. In other words, the barrier layers 222 function as strain compensation layers relaxing the compressive stress applied to the quantum well layers 221. Thus, crystal defects resulting from the compressive stress can be suppressed, whereby the quantum well layers 221 can have excellent crystallinity with a small number of effects. Therefore, regions capable of contributing to light emission in the quantum well layers 221 are increased, whereby the luminous efficiency is improved, and the threshold current can be reduced in response thereto.

Further, the thickness of each barrier layer 222 is set to 3 nm to 8 nm and the Al composition therein is set to not more than 5%, whereby the average refractive index around the active layer 10 is increased. Thus, an excellent light confining effect can be implemented, and the threshold current is further reduced.

Figure 14:
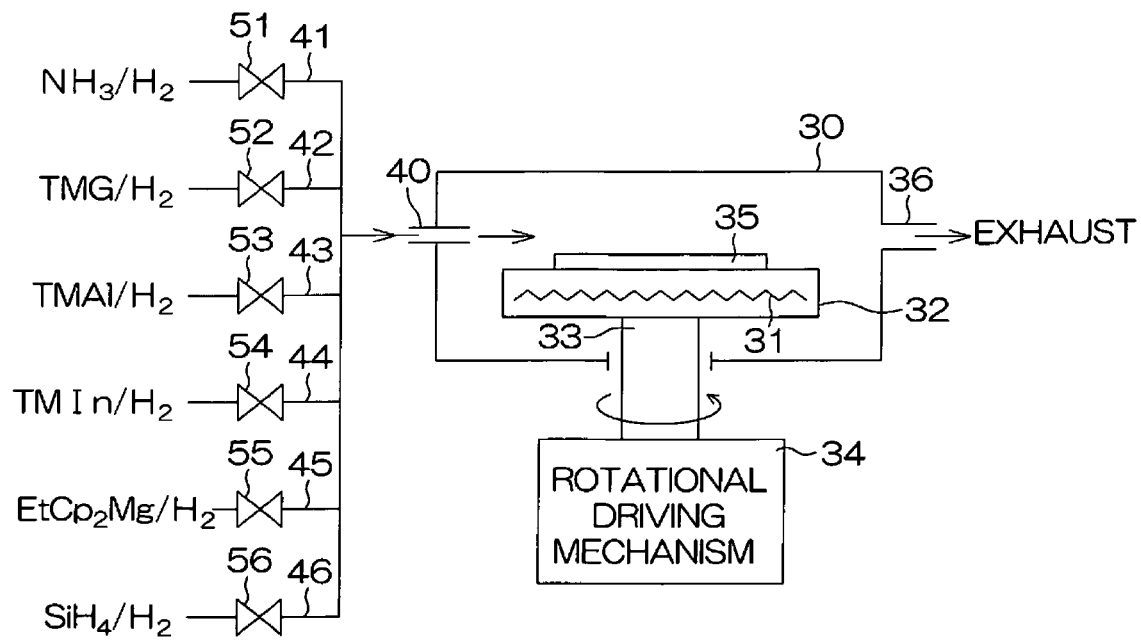
FIG. 14 is a schematic diagram for illustrating the structure of a treating apparatus for growing layers constituting a group III nitride semiconductor multilayer structure.

FIG. 14 is a schematic diagram for illustrating the structure of a treating apparatus for growing the layers constituting the group III nitride semiconductor multilayer structure 2. A susceptor 32 storing a heater 31 is arranged in a treating chamber 30. The susceptor 32 is coupled to a rotating shaft 33, which in turn is rotated by a rotational driving mechanism 34 arranged outside the treating chamber 30. Thus, the susceptor 32 holds a wafer 35 to be treated, so that the wafer 35 can be heated to a prescribed temperature and rotated in the treating chamber 30. The wafer 35 is a GaN monocrystalline wafer constituting the aforementioned GaN monocrystalline substrate 1.

An exhaust pipe 36 is connected to the treating chamber 30. The exhaust pipe 36 is connected to exhaust equipment such as a rotary pump. Thus, the pressure in the treating chamber 30 is set to 1/10 atm to ordinary pressure, and the atmosphere in the treating chamber 30 is regularly exhausted.

On the other hand, a source gas feed passage 40 for feeding source gas toward the surface of the wafer 35 held by the susceptor 32 is introduced into the treating chamber 30. A nitrogen material pipe 41 feeding ammonia as nitrogen source gas, a gallium material pipe 42 feeding trimethyl gallium (TMG) as gallium source gas, an aluminum material pipe 43 feeding trimethyl aluminum (TMAl) as aluminum source gas, an indium material pipe 44 feeding trimethyl indium (TMIn) as indium source gas, a magnesium material pipe 45 feeding ethylcyclopentadienyl magnesium (EtCp$_2$Mg) as magnesium source gas and a silicon material pipe 46 feeding silane (SiH$_4$) as silicon source gas are connected to the source gas feed passage 40. Valves 51 to 56 are interposed in the pipes 41 to 46 respectively. Each source gas is fed along with the carrier gas consisting of hydrogen and/or nitrogen.

For example, a GaN monocrystalline wafer having a major surface defined by an m-plane is held by the susceptor 32 as the wafer 35. In this state, the nitrogen material valve 51 is opened while the valves 52 to 56 are kept closed, so that the carrier gas and ammonia gas (nitrogen source gas) are fed into the treating chamber 30. Further, the heater 31 is electrified, to increase the wafer temperature to 1000° C. to 1100° C. (1050° C., for example). Thus, GaN semiconductors can be grown without roughening the surface.

After the wafer temperature reaches 1000° C. to 1100° C., the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type GaN contact layer 13 consisting of a GaN layer doped with silicon is grown on the surface of the wafer 35.

Then, the aluminum material valve 53 is opened, in addition to the nitrogen material valve 51, the gallium material valve 52 and the silicon material valve 56. Thus, ammonia, trimethyl gallium, silane and trimethyl aluminum are fed from the source gas feed passage 40 along with the carrier gas. Consequently, the n-type AlGaN cladding layer 14 is epitaxially grown on the n-type GaN contact layer 13. The flow rate of each source gas (particularly the aluminum material gas) is adjusted so that the Al composition in the AlGaN cladding layer 14 is not more than 5%.

Then, the aluminum material valve 53 is closed, while the nitrogen material valve 51, the gallium material valve 52, the indium material valve 54 and the silicon material valve 56 are opened. Thus, ammonia, trimethyl gallium, trimethyl indium and silane are fed from the source gas feed passage 40 along with the carrier gas. Consequently, the n-type InGaN guide layer 15 is epitaxially grown on the n-type AlGaN cladding layer 14. In the formation of the n-type InGaN guide layer 15, the temperature of the wafer 35 is preferably set to 800° C. to 900° C. (850° C., for example).

Then, the silicon material valve 56 is closed, and the active layer 10 (light emitting layer) having the multiple-quantum well structure is grown. The active layer 10 can be grown by alternately carrying out a step of growing the quantum well layer 221 consisting of an InGaN layer by opening the nitrogen material valve 51, the gallium material valve 52 and the indium material valve 54 for feeding ammonia, trimethyl gallium and trimethyl indium to the wafer 35 and a step of growing the barrier layer 222 consisting of an AlGaN layer by closing the indium material valve 54 and opening the nitrogen material valve 51, the gallium material valve 52 and the aluminum material valve 53 for feeding ammonia, trimethyl gallium and trimethyl aluminum to the wafer 35. More specifically, the barrier layer 222 is formed at first, and the quantum well layer 221 is formed thereon. These steps are repeated twice, for example, and the barrier layer 222 is finally formed. In the formation of each barrier layer 222, the flow rate of each source gas (particularly the aluminum material gas) is adjusted so that the Al composition in the formed layer is not more than 5%. In the formation of the active layer 10, the temperature of the wafer 35 is preferably set to 700° C. to 800° C. (730° C., for example), for example.

Then, the aluminum material valve 53 is closed, and the nitrogen material valve 51, the gallium material valve 52, the indium material valve 54 and the magnesium material valve 55 are opened. Thus, ammonia, trimethyl gallium, trimethyl indium and ethylcyclopentadienyl magnesium are fed to the wafer 35, to form the guide layer 16 consisting of a p-type InGaN layer doped with magnesium. In the formation of the p-type InGaN guide layer 16, the temperature of the wafer 35 is preferably set to 800° C. to 900° C. (850° C., for example).

Then, the p-type AlGaN electron blocking layer 17 is formed. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed to the wafer 35, to form the p-type AlGaN electron blocking layer 17 consisting of an AlGaN layer doped with magnesium. In the formation of the p-type AlGaN electron blocking layer 17, the temperature of the wafer 35 is preferably set to 900° C. to 1100° C. (1000° C., for example).

Then, the p-type AlGaN cladding layer 18 is formed. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed to the wafer 35, to form the cladding layer 18 consisting of a p-type AlGaN layer doped with magnesium. In the formation of the p-type AlGaN cladding layer 18, the temperature of the wafer 35 is preferably set to 900° C. to 1100° C. (1000° C., for example). Further, the flow rate of each source gas (particularly the aluminum source gas) is preferably adjusted so that the Al composition in the p-type AlGaN cladding layer 18 is not more than 5%.

Then, the p-type GaN contact layer 19 is formed. In other words, the nitrogen material valve 51, the gallium material valve 52 and the magnesium material valve 55 are opened, and the remaining valves 53, 54 and 56 are closed. Thus, ammonia, trimethyl gallium and ethylcyclopentadienyl magnesium are fed to the wafer 35, to form the p-type GaN contact layer 19 consisting of a GaN layer doped with magnesium. In the formation of the p-type GaN contact layer 19, the temperature of the wafer 35 is preferably set to 900° C. to 1100° C. (1000° C., for example).

The layers constituting the p-type semiconductor layered portion 12 are preferably crystal-grown at an average growth temperature of not more than 1000° C. Thus, thermal damage on the active layer 10 can be reduced.

When each of the layers 10 and 13 to 19 constituting the group III nitride semiconductor multilayer structure 2 is grown on the wafer 35 (the GaN monocrystalline substrate 1), a V/III ratio indicating the ratio of the molar fraction of the nitrogen material (ammonia) to the molar fraction of the gallium material (trimethyl gallium) fed to the wafer 35 in the treating chamber 30 is maintained at a high value of not less than 1000 (preferably not less than 3000). More specifically, the average V/III ratio is preferably not less than 1000 from the n-type cladding layer 14 to the uppermost p-type GaN contact layer 19. Thus, excellent crystals having small numbers of point defects can be obtained in all of the n-type cladding layer 14, the active layer 10 and the p-type cladding layer 18.

According to the embodiment, the group III nitride semiconductor multilayer structure 2 having the major surface defined by the m-plane or the like is grown in a dislocation-free state in a planar manner without interposing a buffer layer between the GaN monocrystalline substrate 1 and the group III nitride semiconductor multilayer structure 2. The group III nitride semiconductor multilayer structure 2 has neither stacking faults nor threading dislocations formed from the major surface of the GaN monocrystalline substrate 1.

When the group III nitride semiconductor multilayer structure 2 is grown on the wafer 35 in the aforementioned manner, the wafer 35 is introduced into an etching apparatus, and the ridge stripe 20 is formed by partially removing the p-type semiconductor layered portion 12 by dry etching such as plasma etching, for example. The ridge stripe 20 is formed to be parallel to the c-axis direction.

After the formation of the ridge stripe 20, the insulating layers 6 are formed. The insulating layers 6 are formed by a lift-off step, for example. In other words, the insulating layers 6 can be formed by forming a striped mask, thereafter forming an insulator thin film to entirely cover the p-type AlGaN cladding layer 18 and the p-type GaN contact layer 19, and thereafter lifting off the insulating thin film to expose the p-type GaN contact layer 19.

Then, the p-type electrode 4 in ohmic contact with the p-type GaN contact layer 19 is formed, and the n-type electrode 3 in ohmic contact with the substrate 1 is formed. The electrodes 3 and 4 can be formed by resistance heating or in a metal vapor deposition apparatus employing an electron beam, for example.

The next step is division into each individual device. In other words, each device constituting the semiconductor laser diode is cut out by cleaving the wafer 35 in a direction parallel to the ridge stripe 20 and a direction perpendicular thereto. The wafer 35 is cleaved in the direction parallel to the ridge stripe 20 along the a-plane. Further, the wafer 35 is cleaved in the direction perpendicular to the ridge stripe 20 along the c-plane. Thus, the cavity end face 21 defined by the +c-plane and the cavity end face 22 defined by the −c-plane are formed.

Then, the aforementioned insulating films 23 and 24 are formed on the cavity end faces 21 and 22 respectively. The insulating films 23 and 24 can be formed by electron cyclotron resonance (ECR) film formation, for example. The insulating films 23 and 24 constitute the aforementioned distributed Bragg reflectors, and the $ZrO_2$ films each having the thickness $\lambda_c/4n_1$ and the $SiO_2$ films each having the thickness $\lambda_c/4n_2$ are alternately stacked and formed on the cavity end faces 21 and 22 respectively.

While the embodiment of the present invention has been described, the present invention may be embodied in other ways.

For example, while the ridge stripe 20 is formed parallelly to the c-axis in the aforementioned embodiment, the ridge stripe 20 may alternatively be formed parallelly to the a-axis, and the cavity end faces may be defined by a-planes. The major surface of the substrate 1 is not restricted to the m-plane, but may be defined by an a-plane which is another nonpolar plane, or by a semipolar plane.

The thicknesses of and the impurity concentrations in the layers constituting the group III nitride semiconductor multilayer structure 2 are merely examples, and appropriate values can be properly selected and employed.

After the formation of the group III nitride semiconductor multilayer structure 2, the substrate 1 can be removed by laser lift off or the like, so that the semiconductor laser diode has no substrate 1.

While the device has the light emitting layer of the multiple-quantum well structure provided with the plurality of quantum well layers in the aforementioned embodiment, the light emitting layer may alternatively have a quantum well structure provided with one quantum well layer.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-96825 filed with the Japanese Patent Office on Apr. 3, 2008, the disclosure of which is incorporated herein by reference.

What is claimed is:

1. A semiconductor laser device made of a group III nitride semiconductor having a major growth surface defined by a nonpolar plane or a semipolar plane, comprising:
a cavity including an active layer containing In; and
distributed Bragg reflectors coating both cavity end faces of the cavity respectively, each of the reflectors having a central wavelength $\lambda_c$ of a reflectance spectrum satisfying the relation $\lambda_{SP}-10$ nm$\leq\lambda_c\leq\lambda_{SP}+10$ nm with respect to an emission peak wavelength $\lambda_{SP}$ of spontaneous emission in the active layer,
wherein the emission peak wavelength of the spontaneous emission is a peak wavelength of a current injection spectrum at a current density of not more than 0.1 kA/cm².

2. The semiconductor laser device according to claim 1, wherein the central wavelength $\lambda_c$ of the reflectance spectrum of each of the distribution Bragg reflectors satisfies the relation $\lambda_{SP}-5$ nm$\leq\lambda_c\leq\lambda_{SP}+5$ nm with respect to the emission peak wavelength $\lambda_{SP}$ of the spontaneous emission in the active layer.

3. The semiconductor laser device according to claim 1, wherein the emission peak wavelength of the spontaneous emission is a peak wavelength of a current injection spectrum at a current density of not more than 500 μA/cm².

4. The semiconductor laser device according to claim 1, wherein the emission peak wavelength of the spontaneous emission is a photoluminescence peak wavelength in a case of weakly exciting the active layer at an excitation density of not more than 30 W/cm².

5. The semiconductor laser device according to claim 1, wherein the emission wavelength of the active layer is not less than 450 nm.

6. The semiconductor laser device according to claim 1, wherein the active layer includes a quantum well layer having a thickness of not more than 100 Å.

7. The semiconductor laser device according to claim 1, wherein the major growth surface is defined by an m-plane.

8. The semiconductor laser device according to claim 1, wherein a cavity direction is a c-axis direction, and the cavity end faces are defined by c-planes formed by cleavage.

9. A semiconductor laser device made of a group III nitride semiconductor having a major growth surface defined by a nonpolar plane or a semipolar plane, comprising:
a cavity including an active layer containing In; and
distributed Bragg reflectors coating both cavity end faces of the cavity respectively, each of the reflectors having a central wavelength $\lambda_c$ of a reflectance spectrum satisfying the relation $\lambda_{SP}-10$ nm$\leq\lambda_c\leq\lambda_{SP}+10$ nm with respect to an emission peak wavelength $\lambda_{SP}$ of spontaneous emission in the active layer,
wherein the emission peak wavelength of the spontaneous emission is a peak wavelength of a current injection spectrum at a current density of not more than 500 μA/cm².

10. The semiconductor laser device according to claim 9, wherein the central wavelength $\mu_c$ of the reflectance spectrum of each of the distribution Bragg reflectors satisfies the relation $\lambda_{SP}-5$ nm$\leq\lambda_c\leq\lambda_{SP}+5$ nm with respect to the emission peak wavelength $\lambda_{SP}$ of the spontaneous emission in the active layer.

11. The semiconductor laser device according to claim 9, wherein the emission peak wavelength of the spontaneous emission is a photoluminescence peak wavelength in a case of weakly exciting the active layer at an excitation density of not more than 30 W/cm².

12. The semiconductor laser device according to claim 9, wherein the emission wavelength of the active layer is not less than 450 nm.

13. The semiconductor laser device according to claim 9, wherein the active layer includes a quantum well layer having a thickness of not more than 100 Å.

14. The semiconductor laser device according to claim 9, wherein the major growth surface is defined by an m-plane.

15. The semiconductor laser device according to claim 9, wherein a cavity direction is a c-axis direction, and the cavity end faces are defined by c-planes formed by cleavage.

16. A semiconductor laser device made of a group III nitride semiconductor having a major growth surface defined by a nonpolar plane or a semipolar plane, comprising:
a cavity including an active layer containing In; and
distributed Bragg reflectors coating both cavity end faces of the cavity respectively, each of the reflectors having a central wavelength $\lambda_c$ of a reflectance spectrum satisfying the relation $\lambda_{SP}-10$ nm$\leq\lambda_c\leq\lambda_{SP}+10$ nm with respect to an emission peak wavelength $\lambda_{SP}$ of spontaneous emission in the active layer, wherein the emission peak wavelength of the spontaneous emission is a photoluminescence peak wavelength in a case of weakly exciting the active layer at an excitation density of not more than 30 W/cm$^2$.

17. The semiconductor laser device according to claim 16, wherein the central wavelength $\lambda_c$ of the reflectance spectrum of each of the distribution Bragg reflectors satisfies the relation $\lambda_{SP}-5$ nm $\leq \lambda_c \leq \lambda_{SP}+5$ nm with respect to the emission peak wavelength $\lambda_{SP}$ of the spontaneous emission in the active layer.

18. The semiconductor laser device according to claim 16, wherein the emission peak wavelength of the spontaneous emission is a peak wavelength of a current injection spectrum at a current density of not more than 0.1 kA/cm$^2$.

19. The semiconductor laser device according to claim 16, wherein the emission peak wavelength of the spontaneous emission is a peak wavelength of a current injection spectrum at a current density of not more than 500 μA/cm$^2$.

20. The semiconductor laser device according to claim 16, wherein the emission wavelength of the active layer is not less than 450 nm.

21. The semiconductor laser device according to claim 16, wherein the active layer includes a quantum well layer having a thickness of not more than 100 Å.

22. The semiconductor laser device according to claim 16, wherein the major growth surface is defined by an m-plane.

23. The semiconductor laser device according to claim 16, wherein a cavity direction is a c-axis direction, and the cavity end faces are defined by c-planes formed by cleavage.

* * * * *